(12) United States Patent
Kathrein (10) Patent No.: US 8,293,359 B2
(45) Date of Patent: Oct. 23, 2012

(54) MULTILAYER CVD-COATING AND TOOL WITH SUCH A COATING

(75) Inventor: Martin Kathrein, Reutte (AT)

(73) Assignee: Ceratizit Austria Gesellschaft mbH, Reutte/Tirol (AT)

( * ) Notice: Subject to any disclaimer, the term of this patent is extended or adjusted under 35 U.S.C. 154(b) by 381 days.

(21) Appl. No.: 12/594,383

(22) PCT Filed: Mar. 31, 2008

(86) PCT No.: PCT/AT2008/000118
§ 371 (c)(1),
(2), (4) Date: Nov. 23, 2009

(87) PCT Pub. No.: WO2008/119095
PCT Pub. Date: Oct. 9, 2008

(65) Prior Publication Data
US 2010/0119315 A1 May 13, 2010

(30) Foreign Application Priority Data

Apr. 2, 2007 (AT) ..................................... 212/07 U (51) Int. Cl.
*B32B 9/00* (2006.01)
(52) U.S. Cl. ............ 428/216; 51/307; 51/309; 428/336; 428/697; 428/698; 428/704
(58) Field of Classification Search .................... 51/307, 51/309; 428/216, 336, 697, 698, 699, 704
See application file for complete search history.

(56) References Cited

U.S. PATENT DOCUMENTS

| 4,895,770 A | 1/1990 | Schintlmeister et al. |
| 5,851,680 A * | 12/1998 | Heau .............................. 428/698 |
| 6,824,601 B2 * | 11/2004 | Yamamoto et al. ........... 428/699 |
| 7,087,295 B2 | 8/2006 | Okada et al. |
| 7,267,701 B2 * | 9/2007 | Holzschuh ...................... 51/307 |
| 7,521,132 B2 | 4/2009 | Kathrein et al. |

(Continued)

FOREIGN PATENT DOCUMENTS

AT 008346 U1 6/2006

(Continued)

OTHER PUBLICATIONS

Stoiber et al.: "PACVD TiN/Ti-B-N multilayers: from micro- to nano-scale" Computational Linguistics and Intelligent Text Processing. 5th International Conference, Cicling 2004. Proceedings (Lecture Notes in Comput. SCI. vol. 2945) Springer-Verlag Berlin, Germany, 2004, pp. 348-354, XP002489375.

(Continued)

*Primary Examiner* — Archene Turner
(74) *Attorney, Agent, or Firm* — Laurence A. Greenberg; Werner H. Stemer; Ralph E. Locher (57) ABSTRACT

A multi-layer CVD coating has at least one coating layer made of a metallic hard material layer X having a thickness of 10 to 90 nm, and at least one additional coating layer made of a metallic hard material layer Y doped with boron, having a boron content of 0.005 to 5 At. % and a thickness of 10 to 90 nm. At least one coating layer X adjoins a coating layer Y. The novel coatings exhibit significantly improved wear resistance.

21 Claims, 4 Drawing Sheets

U.S. PATENT DOCUMENTS 7,820,308 B2 * 10/2010 Park et al. .................. 428/697
2005/0042482 A1 2/2005 Okada et al.

FOREIGN PATENT DOCUMENTS

| | | |
|---|---|---|
| EP | 0306077 A2 | 3/1989 |
| EP | 1473101 A1 | 11/2004 |
| JP | 58209553 A | 12/1983 |

OTHER PUBLICATIONS

Jayaraman et al.: "HfB2 and Hf-B-N hard coatings by chemical vapor deposition" Surface and Coatings Technology, Elsevier, Amsterdam, NL, vol. 200, Nr. 22-23, Jun. 20, 2006, pp. 6629-6633, XP005422360.

Holzschuh: "Deposition of Ti-B-N (single and multilayer) and Zr-B-N coatings by chemical vapor deposition techniques on cutting tools", Thin Solid Films, Elsevier-Sequoia S.A. Lausanne, CH, vol. 469-470, Dec. 22, 2004, pp. 92-98, XP004663293.

International Search Report dated Jul. 23, 2008.

Austrian Search Report dated Jul. 17, 2007.

* cited by examiner

MULTILAYER CVD-COATING AND TOOL WITH SUCH A COATING

BACKGROUND OF THE INVENTION

Field Of The Invention

The invention relates to a multilayer CVD coating having a thickness of from 0.5 μm to 16 μm and a tool provided with such a coating.

To increase the wear resistance of tools which are subject to wear stress, in particular cutting tools and wear parts, highly wear-resistant hard material coatings are applied thereto by means of chemical or physical deposition of coatings from the vapor or gas phase. These coatings usually have hardnesses in the range from 15 to 40 GPa. Wear-resistant hard material coatings are generally deposited on wear-resistant substrate materials. The group of wear-resistant materials for substrates include cemented carbides, cermets, hard materials and tool steels, to name only the most important representatives. For the purposes of the present invention, cemented carbide is a composite made up of a carbidic hard material phase and a metallic binder, preferably cobalt. The group of cermet materials encompasses all materials which are made up of one or more ceramic phases and one or more metallic phases. Hard materials encompass all materials having a hardness of >10 GPa. Tool steels are, according to DIN 17300, steels defined by their use in tools.

In principle, a distinction is made between two coating processes for depositing hard material coatings from the vapor or gas phase, namely physical vapor deposition (PVD) and chemical vapor deposition (CVD). Furthermore, there are a multiplicity of process variants for this purpose. For example, in the case of PVD processes, a distinction is made between "dusting-off" methods such as bombardment of the target material by atomic particles (sputtering process) and removal of material from the target by electric arc or spark erosion. Chemical vapor deposition processes can, for example also be carried out in a plasma assisted manner (PA-CVD process). Compared to PVD coatings, CVD coatings have a coarser, columnar crystal structure.

Physical or chemical deposition of coatings enables wear-resistant hard material layers composed of carbides, nitrides, borides, silicides and oxides on suitable substrates to be produced. Physical deposition processes make a wide choice of chemical compositions of the hard material coatings possible. Uniform coating of bodies having complex geometric shapes is difficult and costly. However, process temperatures which are generally below 500° C. allow the use of movable holder systems for the tools to be coated.

The thermally activated CVD process displays independent characteristic process features which are predominantly the result of the high deposition temperatures. The coating deposition temperatures of thermally activated CVD processes for producing hard material coatings are above 500° C. Movement of the substrates during the coating process is technically difficult to achieve. Among the hard material coatings produced by means of the CVD process, carbides and nitrides and also carbonitrides and oxynitrides of the elements Ti, Zr and Hf, in particular titanium, have been found to be particularly advantageous and are widely used for prolonging the useful life of tools, in particular cutting tools. These are often employed in a single-layer or multilayer design and also in combination with aluminum oxide. An important characteristic feature of CVD coatings is the pronounced crystalline structures which often display preferential textures. This generally also results in a rough surface structure which is flattened by means of an after-treatment using suitable smoothing processes.

To increase the hardness of the coating, B-containing hard material coatings are also used.

Thus, EP 0 306 077 describes a PVD or CVD metal-boron nitride coating which has a B content of from 1 to 20 atom % and is present as a single phase. The coating can also have a multilayer configuration, with the boron nitride layers having a thickness of from 0.5 to 3 μm and the pure nitride or carbonitride layers having thicknesses of from 0.1 to 1 μm.

DE 102 22 347 describes a TiBN layer produced by a CVD process which has a boron content of greater than or equal to 6% by weight.

EP 1 365 045 describes a TiBN layer produced by means of a CVD process having a boron content of greater than or equal to 6 atom %.

The examples describe a multilayer outer coating which has a thickness of about 6 μm. It is composed of about 30 layers, with a comparatively thin TiN layer being covered by a TiBN layer which is from about three to five times as thick. The TiBN layers are preferably mixed phase layers composed of TiN and $TiB_2$. From 50% to 60% of the mixed phase is present as titanium diboride ($TiB_2$). The TiN layers preferably each have the same thickness. The TiBN layers are likewise preferably of equal thickness.

In summary, it can be concluded from the publications of the prior art that the addition of boron significantly increases the hardness. The higher the boron content and the greater the thickness of the coating, the more effectively is the wear resistance improved. An upper limit is imposed on the boron content by, in particular, the occurrence of boride formation in the substrate, which is associated with embrittlement in the region of the interface. For this reason, comparatively thick B-containing hard material coatings which can alternate with boron-free hard material layers are used in the prior art. The boron-free hard material layers here act as diffusion barrier layers.

A high boron content not only increases the risk of embrittlement but can also, particularly in use as cutting tool and here especially for the machining of steels, lead to reaction of the boron with iron.

Due to the disadvantages of the prior art and the continual efforts to improve the life of tools and thus contribute to a higher productivity of the tools, it is an object of the invention to provide a CVD coating which has improved abrasion resistance combined with the highest possible toughness and chemical resistance, in particular at high use temperatures. In addition, it should have advantageous tribological properties.

BRIEF SUMMARY OF THE INVENTION

The object is achieved by the features of the independent claims.

The multilayer CVD coating has a thickness of from 0.5 μm to 16 μm. At least one layer of the CVD coating consists of a metallic hard material layer X from the group consisting of nitrides, carbides, carbonitrides, carbooxynitrides of one or more elements of the group consisting of Ti, Al, Hf, Zr having a thickness of from 10 to 90 nm. At least one further layer consists of a boron-doped metallic hard material layer Y from the group consisting of nitrides, carbides, carbonitrides, carbooxynitrides of one or more elements of the group consisting of Ti, Al, Hf, Zr, where the boron content is from 0.005 to 5 atom % and the thickness is from 10 to 90 nm. At least one layer X adjoins a layer Y. A transition zone can be formed between X and Y by interdiffusion or by means of gas residues during the coating process. The thickness of the transition zone is preferably less than 10 nm.

To date, it has generally been assumed that nanostructured coatings cannot be produced by CVD techniques because of the high deposition temperatures and the diffusion associated therewith.

It has now surprisingly been found that nanostructured coatings can be produced by means of thermal CVD processes. The configuration according to the invention of the X and Y hard material layers produces a very finely crystalline layer structure which in turn results in a very smooth surface structure. Complicated, subsequent smoothing of the surface can thus be dispensed with. The X and Y hard material layers preferably have preferential orientations in the [111] and [311] directions. At thicknesses of the individual layers in the range according to the invention, the lattice stresses of the multilayer coating of the invention exceed those of a boron-containing single layer, as is explained in more detail in the examples (see also FIG. 10). Since the lattice stresses are directly proportional to the hardness of the layer, the wear resistance also increases with increasing lattice stress. It is in this way possible to keep the boron content in the Y layers below 5 atom %. This avoids the disadvantages of a high boron content, namely embrittlement and reaction with the material to be machined. At boron contents below 0.005 atom %, a sufficient effect is not achieved. A particularly advantageous range is from 0.3 to 3 atom %.

The coating of the invention displays pronounced advantages over the prior art, especially in the case of tribological stresses associated with high forces or sudden loading, as is the case, for example, for milling tools. As indicated in the examples, a doubling of the operating life can be achieved. This excellent wear behavior is attributable to the low boron content combined with the high lattice stresses. Long-term use under conditions which lead to a high temperature in the cutting edge region also does not decrease the hardness of the coating. There is therefore surprisingly no unacceptably high interdiffusion, especially of boron, between the Y and X layers. The fine-grain structure of the individual layers also leads to a high toughness of the coating combined with a low tendency of the cutting edges to become chipped.

To achieve high lattice stresses by means of nano-structuring, it is advantageous for the CVD coating to comprise at least 3 layers of the hard material layer X and 3 layers of the hard material layer Y. Furthermore, it is advantageous for the layer sequence to be X, Y, X, Y, X and the X, Y sequence to be repeated at least 5 times. Excellent results can be achieved when the total number of the layers X, Y is from 10 to 500, preferably from 30 to 300.

The range for the average thickness of the layers X and Y is from 10 to 90 nm. Below 10 nm, the interdiffusion of boron increases. At layer thicknesses above 90 nm, the lattice stress decreases. The preferred range is from 30 to 70 nm. A particularly advantageous structural effect can be achieved when the individual layers have about the same thickness. The average thickness of the layers X preferably deviates by not more than 30% from the average layer thickness of Y. Furthermore, it is advantageous for at least one hard material layer X to have the composition $Ti_aN_b$, where $0.4<a<0.6$ and $0.4<b<0.6$.

TiN is one of the longest-known hard materials for coating tools. If boron-containing gases, for example $BCl_3$, are additionally used in the deposition of TiN, a coating having a high hardness but a low toughness and chemical resistance toward iron materials is formed. In the machining of steels, associated with relatively high machining temperatures, this leads, in particular, to high crater wear. The layer structure according to the invention makes it possible to limit the boron content to a minimal but effective range.

A particularly advantageous embodiment of the invention is achieved when at least one hard material layer X, preferably all hard material layers X, has/have the composition $Ti_aC_bN_c$, where $0.4<a<0.6$; $0.05<b<0.45$ and $0.05<c<0.45$. At a boron content of the Y layer of about 4 atom %, a doubling of the life of the tool used could be achieved in a milling experiment carried out dry. Here too, this significant lengthening of the operating life indicates the high toughness reserves of the coating stressed by impacts during milling. In a turning experiment, significant increases in the operating life compared to the prior art could likewise be achieved, both in dry machining and in wet machining, as shown in the examples. A critical factor here is, in particular, the improved abrasion resistance. The structural effect loses effectiveness only at average layer thicknesses of less than 20 nm.

Furthermore, excellent results could be achieved when at least one hard material layer X, preferably all hard material layers X, has/have the composition $Ti_aAl_bN_c$, where $0≦a<0.55$; $0<b<0.55$ and $0.4<c<0.6$. Ti can therefore be replaced completely by Al. The limiting values for a and b are given by the required content for nitride formation. It is also possible to produce metastable layer systems in which the aluminum content can vary within a wide range, leading to formation of different nitridic phases such as fcc-TiN, fcc-AlN or hcp-AlN. Even at boron contents in the Y layer of 1.0 atom %, excellent abrasion resistance could be achieved.

The further addition of carbon also leads to particularly advantageous embodiments, preferably in the case of $Ti_aAl_bC_cN_d$, where $0≦a<0.55$; $0<b<0.55$; $0.05<c<0.45$ and $0.05<d<0.45$. N can here by replaced by C. The limiting values are once again given by the required contents for nitride/carbide formation. Excellent results have also been able to be achieved using hard material layers X having the composition $Hf_aN_b$, where $0.4<a<0.6$ and $0.4<b<0.6$. Here too, the limiting values are given by the required content for nitride formation.

The advantageous embodiments of the Y layers are analogous to those for the X layers, except that the Y layers each have a boron content of from 0.005 to 5 atom %. This gives the following advantageous compositions of the Y layers:

$Ti_aB_bN_c$, where $0.4<a<0.6$; $0.00005<b<0.05$ and $0.4<c<0.6$ $Ti_aB_bC_cN_d$, where $0.4<a<0.6$; $0.00005<b<0.05$; $0.05<c<0.45$ and $0.05<d<0.45$ $Ti_aAl_bB_cN_d$, where $0≦a<0.55$; $0<b<0.55$; $0.00005<c<0.05$ and $0.4<d<0.6$ $Ti_aAl_bB_cC_dN_e$, where $0≦a<0.55$; $0<b<0.55$; $0.00005<c<0.05$; $0.05<d<0.45$ and $0.05<e<0.45$ $Hf_aB_bN_c$ where $0.4<a<0.6$; $0.00005<b<0.05$; $0.4<c<0.6$.

Furthermore, it can be advantageous in process engineering terms to combine a layer X with the corresponding boron-doped Y layer. This means that, with the exception of boron, the components of the Y layer are also present in the X layer.

A further increase in the lattice stress can be achieved when at least two layers of the hard material layer X have a different composition $X_1$, $X_2$, and/or two layers of the hard material layer Y have a different composition $Y_1$, $Y_2$. For example, this gives the layer sequences $X_1$, $X_2$, Y, $X_1$, $X_2$, Y, $X_1$, $X_2$ or X, $Y_1$, $Y_2$, X, $Y_1$, $Y_2$, X, $Y_1$, $Y_2$, . . . .

Minor amounts of oxygen and chlorine due to the process can be present in the hard material layers X and/or Y. This is the case when, in particular, reactive process gases are used in order to achieve a lower deposition temperature in the range from 500 to 700° C. As a result, it is possible for further elements such as chlorine or oxygen atoms to be built into the layer in amounts in the percentage range. A reduction in the chlorine atoms and also rearrangement reactions can be achieved by means of an in-situ or subsequent thermal treatment. This improves the property profile of the coatings. The hard material layer X and/or Y preferably has a structure having two or more crystalline phase constituents. Small amounts of X-ray-amorphous constituents of the microstructure can also be present.

The coating is preferably deposited on tools; the best properties are obtained in combination with the substrate materials cemented carbide or cermet. It is advantageous for the first layer of the coating which is in contact with the cemented carbide or cermet to be titanium nitride or a titanium carbonitride. As uppermost layer (outer layer), it has been found to be particularly advantageous to employ single-layer or multilayer aluminum oxide having a layer thickness of from 2 to 8 μm which can if appropriate be provided with a decorative outer layer and/or be subjected to a mechanical treatment.

The coatings of the invention can preferably be produced by means of the following process sequence.

The coatings of the invention are produced in a CVD coating plant which is preferably equipped with the characteristic features of computer control and process gas control. The gases required for carrying out the process are preferably metered in via mass flow controllers (MFCs) and introduced in pulses in a time sequence (pulse times) required for the purpose of the invention into a gas mixing unit in which a homogeneous gas mixture is produced and is subsequently brought to the reaction temperature in an integrated preheating chamber for the coating process. To achieve the thicknesses of the X and Y layers according to the invention, the pulse times are, depending on the reaction gas composition (see also examples), preferably in the range from 5 s to 200 s. To deposit the coating, the reaction gases are introduced into the reactor which has been prepared for the coating process. The preparation of the coating reactor comprises evacuation of the reaction space together with the substrate materials located therein and subsequent heating to the coating temperature under a protective gas atmosphere.

The CVD reactor is preferably an open system which operates according to the hot wall principle and has a plurality of temperature-controlled segments and in which the reaction gases flow in different flow directions and along different flow paths both vertically and radially through the reaction space in which the object to be coated is present. The process can be carried out either at atmospheric pressure or under subatmospheric pressure. The used process gases are after-treated in a suitable gas purification system. At the end of the coating process, cooling under protective gas is carried out. If desired, a thermal after-treatment of the coatings under specific gas and temperature conditions can be carried out.

BRIEF DESCRIPTION OF THE SEVERAL VIEWS OF THE EMBODIMENTS

The invention is illustrated below by means of production examples.

Table 1 shows the composition of the process gas.
Table 2 shows the results of the wear tests/specimens 1 to 3.
Table 3 shows the results of the wear tests/specimens 6 to 8.

DESCRIPTION OF THE INVENTION

Figure 10:
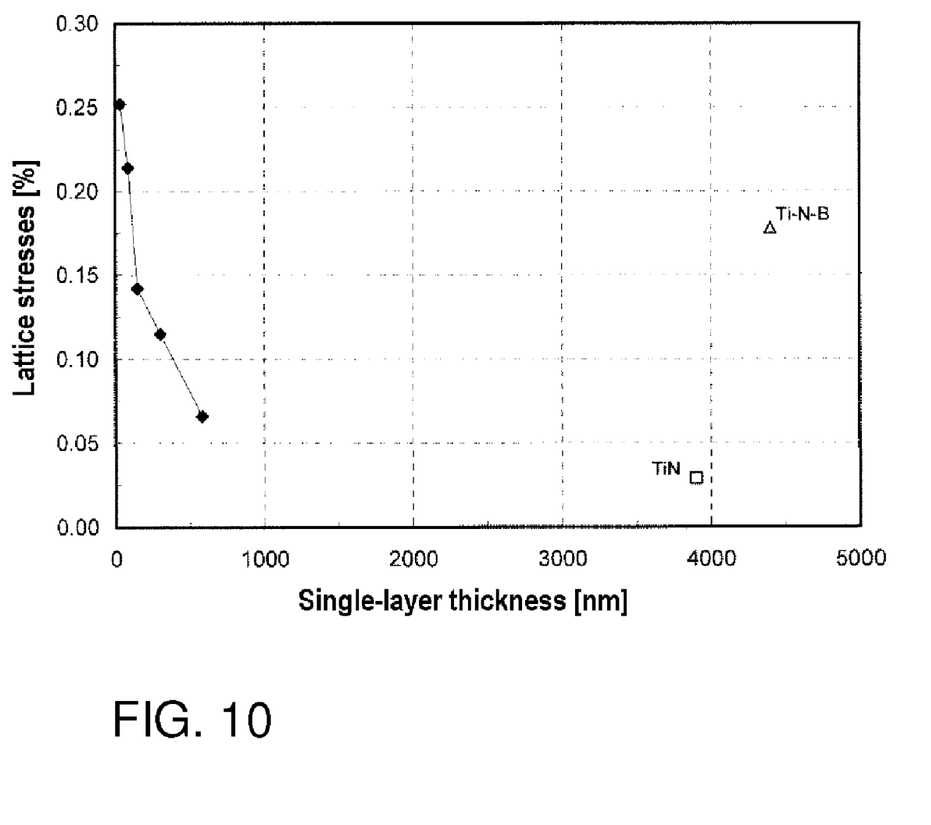
FIG. 10 shows the lattice stresses as a function of the single-layer thickness.

The open symbols represent the lattice stresses in an single-layer coating, while the closed symbols show the lattice stresses in a multilayer coating. The average thickness of the individual layers is plotted on the x axis.

EXAMPLE 1

A multilayer coating of TiN (X layer) and TiNB (Y layer) (according to the invention, specimen 1) was compared with a single-layer coating of TiN (prior art, specimen 2) or TiNB (prior art, specimen 3), where the X and Y layers of the coating according to the invention had the same composition as the respective single-layer coating.

For this purpose, polished round plates suitable for a tribological test by means of a ball-on-disk arrangement were coated with a commercial, fine-grained cemented carbide having a composition of WC-10% by weight of Co. The multilayer TiN and TiNB coating according to the invention was produced in a production CVD coating plant corresponding to the description.

The average deposition temperature of the coating was 900° C. The process gas composition (p=1 bar) is shown in Table 1. The multilayer coating was produced by pulsed switching of the gas compositions shown in Table 1. The pulse time was 60 s. The resulting average thickness of the layers X and Y was about 40 nm, as verified by TEM/EELS. X and Y alternated and the total coating thickness was from 4.1 μm to 5 μm.

The phases and the layer structure parameters such as lattice stresses were determined by XRD line profile analysis. The chemical composition of the coatings applied as single layers was determined using quantitative GDOES and EPMA. A boron content of 4 atom % was found in the TiNB coating.

The images of the structures of the surfaces and the fracture surfaces obtained for specimens 1 to 3 are shown in FIG. 1 to FIG. 6. Specimen 1 according to the invention displays a particularly fine fracture structure with a continuous particularly smooth surface.

Specimens 1 to 3 were subjected to a ball-on-disk wear test for a comparative examination of the abrasion resistance. The counterbody was an $Al_2O_3$ sphere having a diameter of 6 mm, and this was conveyed in a radius of 7 mm in the rubbing track. The experiment was carried out at a pressing force of 5 N at room temperature. The sliding distance was 700 m. The coatings were not rubbed through in the tests. In this quantitative wear test, the resulting degree of wear (Table 2) showed the superior wear resistance of specimen 1 according to the invention compared to the prior art.

TiN/TiNB multilayer coatings were deposited using the production parameters as described above. Different thicknesses of the layers were produced by varying the pulse times to alter the gas composition. The average layer thicknesses can be seen in FIG. 10. The lattice stresses in these coatings and in single-layer coatings of TiN and TiNB were determined as described above. At an average thickness of the layers of less than 90 nm, the lattice stresses are higher than in a single-layer TiNB coating (see FIG. 10).

EXAMPLE 2

An indexable insert was coated with a 3-layer coating composed of, in each case at a thickness of about 1 μm, TiC (adjacent to the cemented carbide), TiCN and TiN (on the outside) as described in the prior art (specimen 4). In the case of the specimen according to the invention, the TiN coating was replaced by a multilayer coating according to the invention composed of (TiN/TiNB)$_{m1}$ (specimen 5).

The substrates were SEKN 1203 AFSN indexable inserts composed of a commercial cemented carbide composed of WC with 9% by weight of Co and 4% by weight of TaC/NbC. The production of the outer TiN (X layer)/TiNB (Y layer) multilayer coating according to the invention was likewise carried out in a production CVD coating plant as described above. The average coating temperature was 900° C.

The process atmosphere is shown in Table 1. The process pressure was 1 bar. The multilayer coating was produced by pulsed switching of the gas composition shown in Table 1. The pulse time was 60 s. The coatings produced had a total thickness of about 2.8 μm, with the outer multilayer coating according to the invention having a thickness of 1 μm. The average thickness of the individual X and Y layers was about 35 nm. The characteristic data for the coatings were determined in a manner corresponding to the description in Example 1.

Specimens 4 and 5 were subjected to a cutting machining experiment under the following conditions. A 42CrMo4 steel (1.7225) (strength: 1100 MPa) was machined dry by climb milling at a cutting velocity of $v_c$=150 m/min, a feed per tooth of $f_z$=0.15 mm and an advance $a_p$=2.0 mm using the single-tooth method on an Ex-Cell-O milling machine. The criterion for stopping the cutting machining experiments was set at a 0.3 mm wear width on the free surface of the main cutter.

Figure 1:
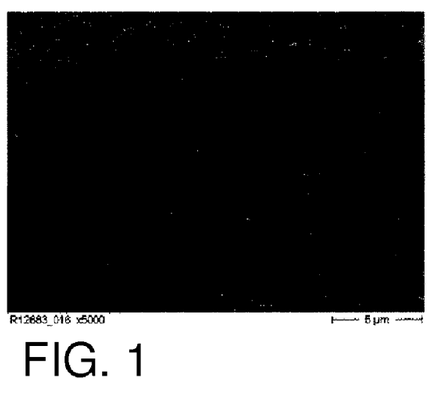
FIG. 1 shows a scanning electron micrograph of the surface of specimen 1 (according to the invention).
Figure 2:
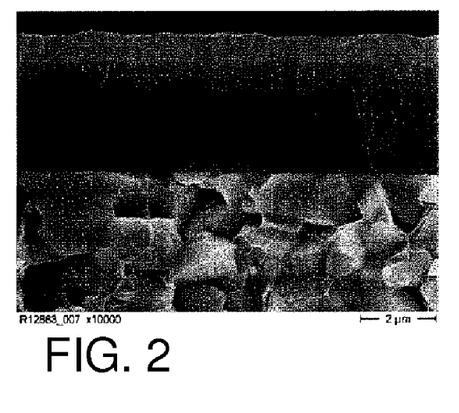
FIG. 2 shows a scanning electron micrograph of the fracture surface of specimen 1 (according to the invention).
Figure 3:
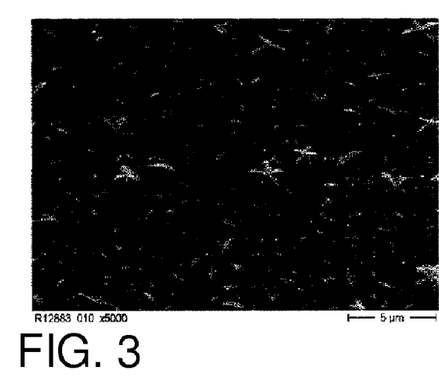
FIG. 3 shows a scanning electron micrograph of the surface of specimen 2 (prior art).
Figure 4:
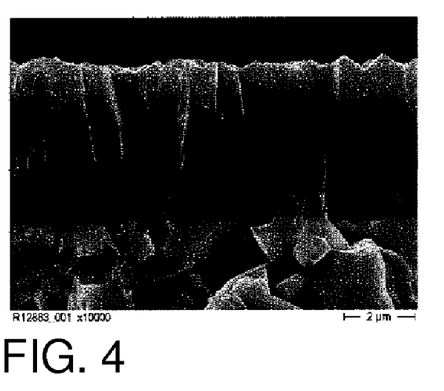
FIG. 4 shows a scanning electron micrograph of the fracture surface of specimen 2 (prior art).
Figure 5:
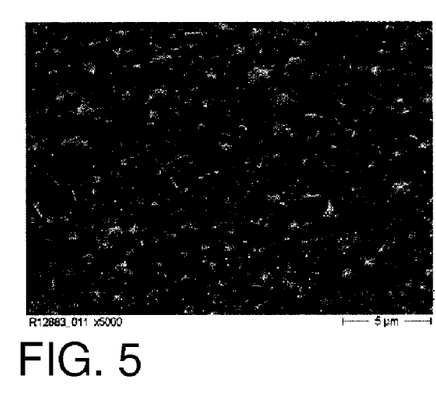
FIG. 5 shows a scanning electron micrograph of the surface of specimen 3 (prior art).
Figure 6:
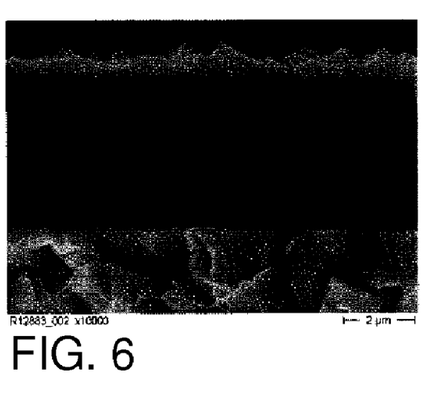
FIG. 6 shows a scanning electron micrograph of the fracture surface of specimen 3 (prior art).
Figure 7:
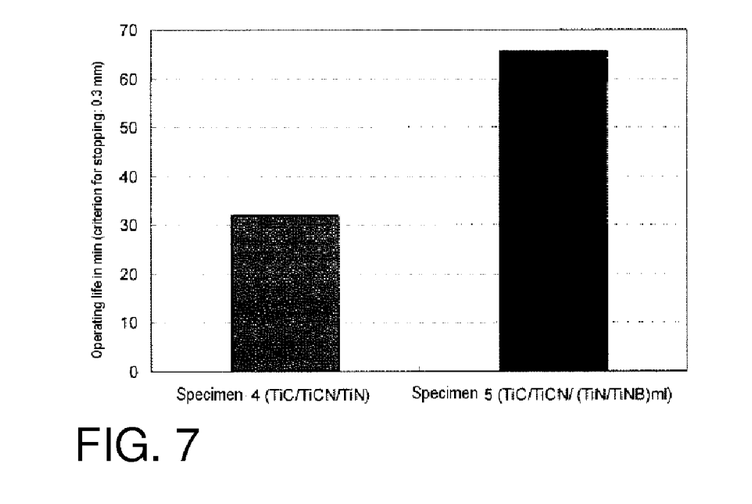
FIG. 7 shows the result of the wear test as per Example 2.

This quantitative cutting machining test (FIG. 7) shows the superior wear resistance of specimen 5 compared to specimen 4. At a criterion for stopping the cutting experiment of 0.3 mm free surface wear, the specimen 5 which has been modified according to the invention shows a doubling of the operating life compared to specimen 4.

EXAMPLE 3

A coating according to the invention having alternating TiCN (X layer) and TiCNB layers (Y) (specimen 6) was compared with a single layer TiCN coating (prior art, specimen 7) and a single-layer TiCNB coating (prior art, specimen 8) each having the same composition as the corresponding layer in the multilayer coating. For this purpose, polished rounded plates of a commercial fine-grained cemented carbide composed of WC with 10% by weight of Co were used as substrate. The coatings were again produced in the manner described. The coating temperature was 950° C. The process atmosphere (p=1 bar) is shown in Table 1. The multilayer coating was produced by pulsed switching of the gas compositions indicated. The pulse time was 60 s. The total thickness of the coating was about 3.5 μm with an average thickness of the TiCN (X) and TiCNB (Y) layers of 30 nm, characterized by the method described in Example 1. A boron content of 3.5 atom % was found in the Y layer.

Specimen 6 according to the invention displayed a particularly smooth surface, which is associated with a fine fracture structure. Specimens 6 to 8 were again subjected to a tribological wear test using the ball-on-disk test apparatus employing the same conditions as in Example 1. The results are shown in Table 3. Once again, the far higher wear resistance of the specimen according to the invention compared to the prior art was demonstrated.

EXAMPLE 4

To determine the wear resistance, the coatings described in Example 3 were deposited on indexable inserts for turning and milling operations. The specimen designations correspond to Example 3. The substrates for the milling test were SEKN 1203 AFSN indexable inserts composed of a commercial cemented carbide composed of WC with 9% by weight of Co and 4% by weight of TaC/NbC. The turning tests were carried out using CNMG 120408 EN-TM indexable inserts composed of a commercial cemented carbide composed of WC with 7% by weight of Co and 8.1% by weight of mixed carbides.

The coatings were produced as described in Example 3. The following conditions were used for the cutting machining experiment. A 42CrMo4 steel (1.7225) (strength: 1100 MPa) was machined dry by climb milling at a cutting velocity of $v_c$=150 m/min, a feed per tooth of $f_z$=0.15 mm and an advance $a_p$=2.0 mm using the single-tooth method on an Ex-Cell-O milling machine. The criterion for stopping the cutting machining experiments was set at a 0.3 mm wear width on the free surface of the main cutter.

On a lathe, a Ck60 steel (1.1221) was machined both dry and using cooling lubricant (wet) by means of the CNMG 120408 EN-TM indexable insert at a cutting velocity $v_c$=200 m/min, a feed of $f_z$=0.25 mm and an advance $a_p$=2.0 mm. The criterion for stopping the turning experiments was set at 0.3 mm wear width on the free surface.

Figure 8:
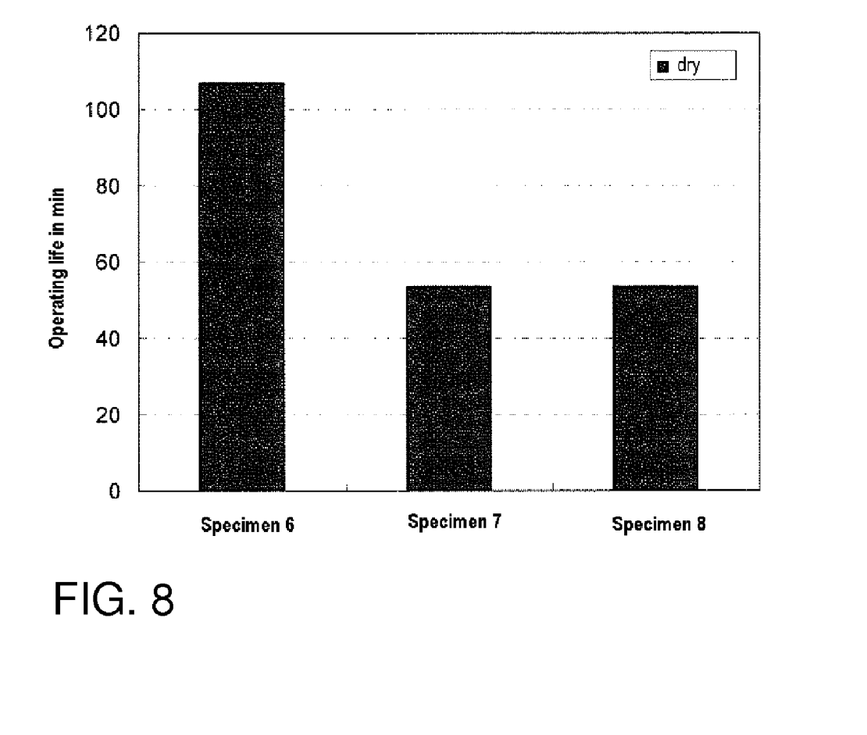
FIG. 8 shows the result of the milling test as per Example 3.
Figure 9:
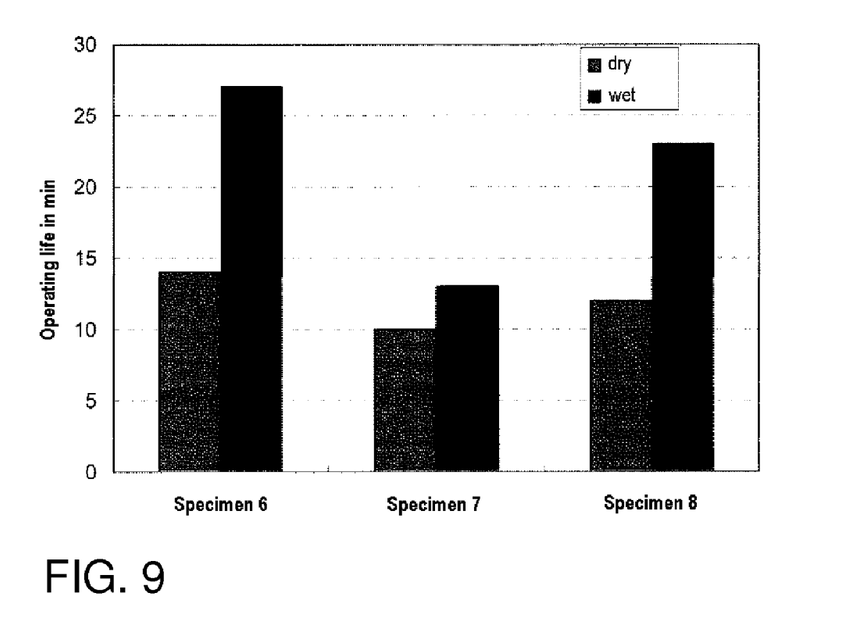
FIG. 9 shows the results of the turning test as per Example 4.

In the milling tests (FIG. 8), it was possible to achieve a doubling of the operating life of specimen 6 with the coating according to the invention compared to specimens 7 and 8 with single-layer coatings. In the turning test (FIG. 9), too, specimen 6 with the coating according to the invention displayed a considerably improved operating life both under dry machining conditions and under wet machining conditions.

EXAMPLE 5

A multilayer coating according to the invention (specimen 9) composed of TiAlN (X layer) and TiAlNB (Y layer) was compared with a single-layer coating composed of TiAlN (prior art, specimen 10) and of TiAlNB (prior art, specimen 11), with the X and Y layers of the coating according to the invention having the same composition as the respective single-layer coating. For this purpose, polished round plates suitable for a tribological test (ball-on-disk) composed of a commercial fine-grained cemented carbide composed of WC with 10% by weight of Co were coated. The coatings were produced in a CVD coating plant as described above. The average temperature was 600° C. The process gas composition (p=1 bar) is shown in Table 1. The multilayer coating was produced by pulsed switching of the gas compositions shown in Table 1. The pulse time was likewise 60 s. The thickness of the individual layers X and Y was about 50 nm. The coatings were characterized in a manner analogous to Example 1. The boron content of the Y layer was 1 atom %. The layers X and Y alternated, and the total thickness of the coating was from 4.8 to 6.7 μm.

Specimen 9 according to the invention once again displayed a fine fracture structure with a continuous smooth surface. Specimens 9 to 11 were subjected to a tribological wear test using the ball-on-disk test apparatus to compare the abrasion resistance. The counterbody was again an $Al_2O_3$ sphere having a diameter of 6 mm which was conveyed in a concentric wear track of 5 mm radius at room temperature and at a pressing force of 2 N. The sliding distance was 100 m. The coating of specimen 10 was rubbed through. The coating of specimen 11 displayed commencement of wear, while specimen 9 displayed no discernable wear.

EXAMPLE 6

A multilayer coating according to the invention (specimen 12) composed of HfN (X layer) and HfNB (Y layer) was compared with a single-layer coating composed of HfN (prior art, specimen 13) and of HfNB (prior art, specimen 14), with the X and Y layers of the coating according to the invention having the same composition as the respective single-layer coating. Specimens for tribological tests were produced in a manner analogous to Examples 1, 3 and 5. The average coating temperature was 1025° C. The process gas composition (p=0.4 bar) is shown in Table 1. The multilayer coating was produced by pulsed switching of the gas compositions shown in Table 1.

The pulse time was 180 s. The thickness of the individual layers X and Y was 25 nm and these layers were characterized in a manner analogous to Example 1. A boron content of 1.3 atom % was found in the Y layer. X and Y alternated, and the total thickness of the coating was from 1.4 μm to 1.9 μm.

Specimen 12 according to the invention displayed a particularly smooth, delicate yellow surface. Specimens 12 to 14 were subjected to a ball-on-disk wear test using test parameters corresponding to Example 1 for a comparative examination of the abrasion resistance.

The coating of specimen 13 was rubbed through during the test. Specimen 12 with the layer structure according to the invention had a lower wear than specimen 14.

TABLE 3

|  | Specimen 6 | Specimen 7 | Specimen 8 |
|---|---|---|---|
| Degree of wear [m³/Nm] | 1.12*E−15 | 1.54*E−15 | 2.03*E−15 |

The invention claimed is:

1. A multilayer CVD coating, comprising:
at least one layer consisting of a metallic hard material layer X selected from the group consisting of nitrides, carbides, carbonitrides, carbooxynitrides of one or more elements of the group consisting of Ti, Al, Hf, and Zr, and having a thickness of from 10 nm to 90 nm;
at least one layer consisting of a boron-doped metallic hard material layer Y selected from the group consisting of nitrides, carbides, carbonitrides, carbooxynitrides of one or more elements of the group consisting of Ti, Al, Hf, and Zr, having a boron content is from 0.005 to 5 atom % and a thickness from 10 nm to 90 nm;
at least one said layer X adjoining a layer Y; and
the coating being a CVD coating and having a thickness of between 0.5 μm and 16 μm.

2. The CVD coating according to claim 1, which comprises a transition zone having a thickness of less than 10 nm formed between said layer X and said layer Y.

3. The CVD coating according to claim 1, which comprises at least three layers of said hard material layer X and three layers of said hard material layer Y.

4. The CVD coating according to claim 1, wherein a layer sequence is X, Y, X, Y, X and a sequence X, Y is repeated at least 5 times.

5. The CVD coating according to claim 1, wherein a total number of said layers X, Y is from 10 to 500.

6. The CVD coating according to claim 5, wherein the total number of the layers X, Y is from 50 to 300.

7. The CVD coating according to claim 1, wherein an average thickness of said layers X and Y is from 30 to 70 nm.

8. The CVD coating according to claim 1, wherein an average thickness of said layers X deviates by not more than 30% from an average thickness of said layers Y.

TABLE 1

|  |  |  | T [° C.] | TiCl4 [% by vol.] | AlCl3 [% by vol.] | HfCl4 [% by vol.] | BCL3 [% by vol.] | CH4 [% by vol.] | NH3 [% by vol.] | N2 [% by vol.] | H2 [% by vol.] | Ar [% by vol.] |
|---|---|---|---|---|---|---|---|---|---|---|---|---|
| Specimen 1, 5* | Specimen 2 | TiN | 900 | 1.8 |  |  |  |  |  | 35.1 | 48.2 | 14.9 |
|  |  | TiN/TiNB | 900 |  |  |  |  |  |  |  |  |  |
|  | Specimen 3 | TiNB | 900 | 0.9 |  |  | 0.2 |  |  | 35.4 | 48.6 | 14.9 |
|  | Specimen 7 | TiCN | 950 | 2.5 |  |  |  | 6.3 |  | 7.5 | 68.7 | 15 |
| Specimen |  | TiCN/TiCNB | 950 |  |  |  |  |  |  |  |  |  |
|  | Specimen 8 | TiCNB | 950 | 2.5 |  |  | 0.2 | 6.2 |  | 7.5 | 68.6 | 15 |
|  | Specimen 10 | TiAlN | 600 | 0.15 | 0.071 |  |  |  | 0.82 |  | 0.11 | 98.849 |
| Specimen 9 |  | TiAlN/TiAlBN | 600 |  |  |  |  |  |  |  |  |  |
|  | Specimen11 | TiAlBN | 600 | 0.15 | 0.071 |  | 0.018 |  | 0.82 |  | 0.11 | 98.831 |
|  | Specimen13 | HfN | 1025 |  |  | 0.55 |  |  |  | 17.5 | 81.95 |  |
| Specimen12 |  | HfN/HfBN | 1025 |  |  |  |  |  |  |  |  |  |
|  | Specimen14 | HfBN | 1025 |  |  | 0.55 | 0.06 |  |  | 17.5 | 81.89 |  |

TABLE 2

|  | Specimen 1 | Specimen 2 | Specimen 3 |
|---|---|---|---|
| Degree of wear [m³/Nm] | 1.78*E−15 | 5.54*E−15 | 2.00*E−15 |

9. The CVD coating according to claim 1, wherein said hard material layer X has at least one composition selected from the group consisting of $Ti_aN_b$, where $0.4<a<0.6$ and $0.4<b<0.6$;

$Ti_aC_bN_c$, where $0.4<a<0.6$; $0.05<b<0.45$ and $0.05<c<0.45$;

$Ti_aAl_bN_c$, where $0\leq a<0.55$; $0<b<0.55$ and $0.4<c<0.6$;

$Ti_aAl_bC_cN_d$, where $0 \leq a<0.55$; $0<b<0.55$; $0.05<c<0.45$ and $0.05<d<0.45$; and $Hf_aN_b$, where $0.4<a<0.6$ and $0.4<b<0.6$.

10. The CVD coating according to claim 1, wherein said hard material layer Y has at least one composition selected from the group consisting of:

$Ti_aB_bN_c$, where $0.4<a<0.6$; $0.00005<b<0.05$ and $0.4<c<0.6$;

$Ti_aB_bC_cN_d$, where $0.4<a<0.6$; $0.00005<b<0.05$; $0.05<c<0.45$ and $0.05<d<0.45$;

$Ti_aAl_bB_cN_d$, where $0 \leq a<0.55$; $0<b<0.55$; $0.00005<c<0.05$ and $0.4<d<0.6$;

$Ti_aAl_bB_cC_dN_e$, where $0 \leq a<0.55$; $0<b<0.55$; $0.00005<c<0.05$; $0.05<d<0.45$ and $0.05<e<0.45$; and $Hf_aB_bN_c$, where $0.4<a<0.6$; $0.00005<b<0.05$; $0.4<c<0.6$.

11. The CVD coating according to claims 1, wherein said boron content of said hard material layer Y is from 0.3 to 3 atom %.

12. The CVD coating according to claim 1, wherein at least one of said hard material layers X and Y includes process-related minor amounts of oxygen and/or chlorine.

13. The CVD coating according to claim 1, wherein at least one of said hard material layer X and said hard material layer Y at least partly has a structure with two or more crystalline phase constituents.

14. The CVD coating according to claims 1, wherein small amounts of X-ray-amorphous constituents of the microstructure are present in at least one of said hard material layer X and said hard material layer Y.

15. A tool, comprising:
a tool body composed of a wear-resistant material;
a multilayer CVD coating on said tool body, said CVD coating having a thickness of between 0.5 μm to 16 μm, and said CVD coating including:
at least one layer consisting of a metallic hard material layer X selected from the group consisting of nitrides, carbides, carbonitrides, carbo-oxynitrides of one or more elements selected of the group consisting of Ti, Al, Hf, and Zr having a thickness of from 10 to 90 nm; and
at least one layer consisting of a boron-doped metallic hard material layer Y selected from the group consisting of nitrides, carbides, carbonitrides, carbooxynitrides of one or more elements selected from the group consisting of Ti, Al, Hf, and Zr with a boron content from 0.005 to 5 atom % and a thickness from 10 to 90 nm; and
wherein at least one layer X adjoins a layer Y.

16. The tool according to claim 15, wherein said wear-resistant material is cemented carbide or cermet.

17. The tool according to claim 15, wherein a first layer adjoining said wear-resistant material is titanium nitride or titanium carbonitride.

18. The tool according to claim 15, wherein an uppermost layer is an oxidic layer having a thickness of from 2 to 8 μm.

19. The tool according to claim 15, wherein the uppermost layer is aluminum oxide.

20. The tool according to claim 15 configured as a cutting tool.

21. The tool according to claim 20, wherein said cutting tool is an indexable insert.

* * * * *